United States Patent
Kennedy et al.

[11] 3,941,625
[45] Mar. 2, 1976

[54] GLASS PASSIVATED GOLD DIFFUSED SCR PELLET AND METHOD FOR MAKING

[75] Inventors: Richard W. Kennedy, Skaneateles; Edward G. Tefft, Auburn, both of N.Y.

[73] Assignee: General Electric Company, Syracuse, N.Y.

[22] Filed: Oct. 11, 1973

[21] Appl. No.: 405,489

[52] U.S. Cl. .............. 148/187; 148/175; 307/284; 357/39
[51] Int. Cl.² ........................................ H01L 21/225
[58] Field of Search ....... 148/175, 187, 186; 357/39

[56] References Cited
UNITED STATES PATENTS

| | | | |
|---|---|---|---|
| 3,275,909 | 9/1966 | Gutzwiller | 357/39 |
| 3,440,113 | 4/1969 | Wolley | 148/187 |
| 3,579,815 | 5/1971 | Gentry | 148/175 X |
| 3,617,398 | 11/1971 | Bilous et al. | 148/175 |
| 3,640,783 | 2/1972 | Bailey | 148/186 |
| 3,701,696 | 10/1972 | Mets | 148/175 |

*Primary Examiner*—L. Dewayne Rutledge
*Assistant Examiner*—J. M. Davis
*Attorney, Agent, or Firm*—Robert J. Mooney; Douglas E. Stoner

[57] ABSTRACT

Disclosed is an SCR pellet and a method for the fabrication thereof. A layer of oxide is grown on a semiconductor wafer that has been diffused to form a plurality of SCR pellets and openings are etched in the oxide at locations corresponding to each pellet. Gold is diffused through the openings into a preselected distribution in the base region to reduce turnoff time. Grooves are etched to facilitate glass passivation and division of the wafer into pellets.

8 Claims, 7 Drawing Figures

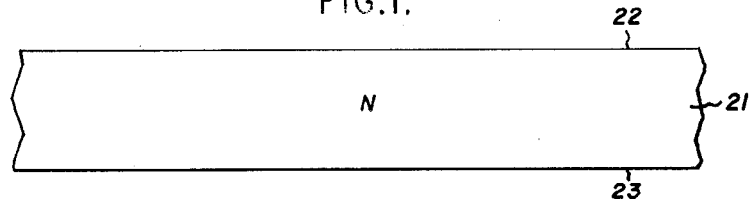
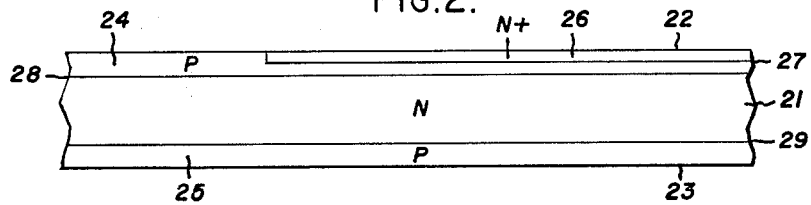
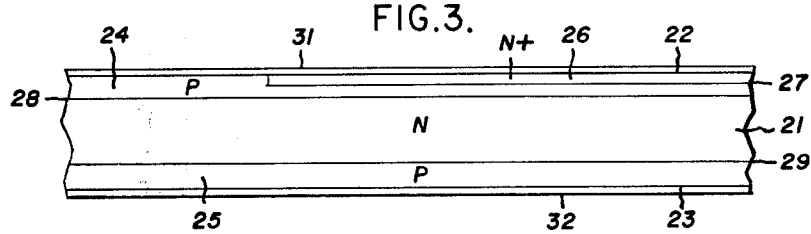
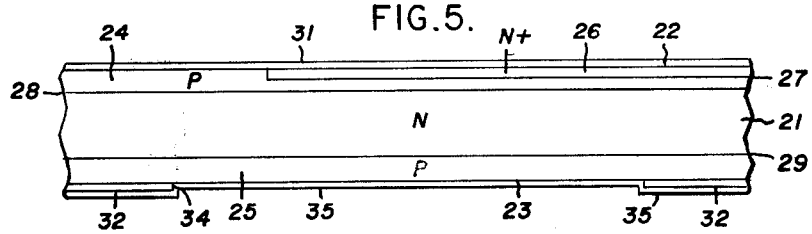
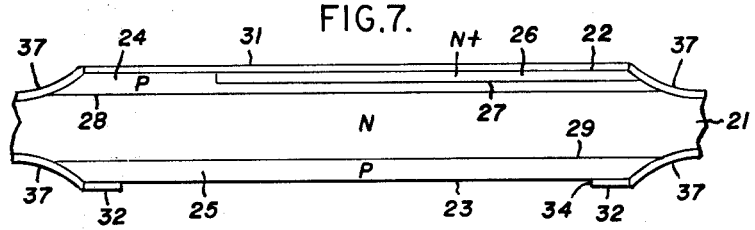
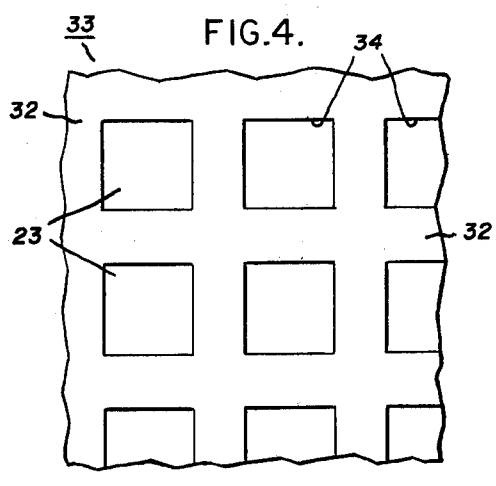
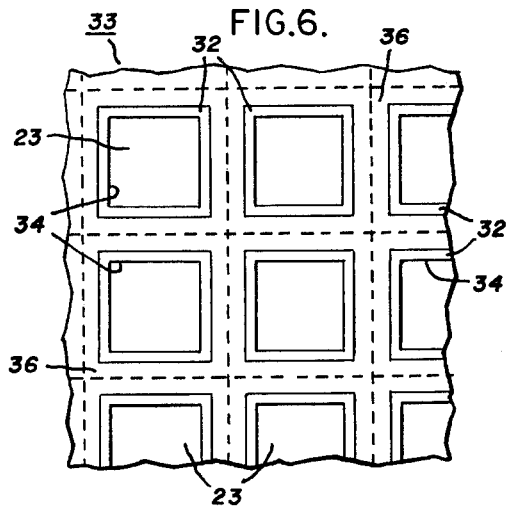

GLASS PASSIVATED GOLD DIFFUSED SCR PELLET AND METHOD FOR MAKING

BACKGROUND OF THE INVENTION

This invention relates to silicon controlled rectifiers and, more particularly, to gold doped fast turnoff silicon controlled rectifiers.

Since their introduction, SCR's have become more popular as circuit designers have continued to employ them in new and different ways. As new applications for SCR's are developed, greater emphasis is placed on improving the performance of the devices under demanding conditions of operation. Different applications require that the emphasis be placed on different characteristics of the device. For example, some potential applications will become commercially feasible only if the cost of the SCR's can be reduced. Other applications require that the devices be able to withstand higher reverse voltages or that they switch from a conductive to a non-conductive state more rapidly. Thus, the device designer is faced with a multi-faceted problem.

One of the principle problems facing the device designer is the interrelationship among the various device characteristics. For example, it is known that if gold is diffused into the interior n doped region of an SCR, the minority carrier lifetime in that region is decreased and thus the turn off time is reduced. However, the effect of the gold diffusion step on the cost of the device must be considered. Also, it is known that glass passivation of the semiconductor pellets forming the SCR's has many beneficial effects. For example, the reverse voltage characteristics are improved as is device reliability. Furthermore, glass passivation improves the manufacturing yield and thus reduces cost. Consequently, an SCR exhibiting desirable properties could seemingly be made by utilizing both gold diffusion and glass passivation techniques. However, this has not heretofore been possible. This is so for the following reason. Glass melts at a lower temperature than that required to perform the gold diffusion. Thus, the glass passivation step must be performed following the gold diffusion step. But the glass passivation process includes an oxide growing step which is performed at a high enough temperature to cause uncontrollable migration and redistribution of the gold. Thus, heretofore, selectively localized gold doping and glass passivation have been considered incompatible operations. Consequently, gold doped SCR's are generally manufactured by a process including blanket gold diffusion of an entire wafer followed by pelletization and individual passivation with silicone rubber.

It is an object of this invention, therefore, to provide an SCR with gold doping and glass passivation and to disclose a method for making such a device.

SUMMARY OF THE INVENTION

This invention is characterized by a silicon controlled rectifier pellet of semiconductor material that defines two major surfaces and includes a plurality of layers of alternating p and n conductivity types thus defining a plurality of p-n junctions. An auxiliary impurity, such as gold or platinum, that stimulates carrier recombination is selectively diffused into the pellet and is preferably included in an interior region of n type conductivity. Glass passivation is included for each of the p-n junctions. Thus, a silicon controlled rectifier is provided that exhibits the reliability in operation and repeatability and economy of manufacture associated with glass passivated devices and furthermore exhibits the rapid turnoff characteristics associated with gold doped devices.

A preferred method for fabricating the subject SCR includes the steps of thermally growing an oxide on at least one of the two major surfaces of a semiconductor wafer that has been suitably doped to render it divisible into a number of SCR pellets. Portions of the oxide corresponding to the SCR pellets are selectively removed to form windows. Gold, or another dopant that stimulates the recombination of charge carriers, is diffused through the windows into an internal n doped region. Thus there is provided a semiconductor wafer suitably doped to form a plurality of SCR pellets, wherein the wafer has been doped with an auxiliary impurity such as gold. Furthermore, oxide remains on the wafer where it is to be grooved. Consequently no more oxide need be grown to permit the etching of grooves to facilitate glass passivation and pellet division.

DESCRIPTION OF THE DRAWINGS

These and other features and objects of the present invention will become more apparent upon a perusal of the following description taken in conjunction with the accompanying drawings wherein:

FIG. 1 is a sectional elevation view of a portion of a semiconductor crystal wafer;

FIG. 2 is a view of the wafer depicted in FIG. 1 following diffusion steps to be described below;

FIG. 3 is a view of the wafer depicted in FIGS. 1 and 2 following an oxidation step;

FIG. 4 is a plan view of the lower surface of the wafer after openings have been etched in the oxide;

FIG. 5 is an elevation view of the wafer shown in FIG. 4;

FIG. 6 is a lower plan view of the wafer during a later processing step; and

FIG. 7 is an elevation view of the wafer shown in FIG. 6.

DESCRIPTION OF THE PREFERRED EMBODIMENT AND METHOD

Referring first to FIG. 1 there is shown an elevation view of a body of semiconductor material 21 which is only a portion of a larger semiconductor wafer such as is conventionally used in the manufacture of semiconductor products. The material 21 is doped with an impurity such as arsenic or phosphorus so that it is of n type conductivity and defines two major surfaces 22 and 23.

Referring now to FIG. 2, another impurity, such as gallium or boron, is diffused into the body 21 from each major surface 22 and 23, thus providing a layer 24 of p type conductivity adjacent the major surface 22 and another layer of p type conductivity 25 adjacent the major surface 23. Next, the major surface 22 is suitably masked and an impurity such as phosphorus or arsenic is diffused into the unmasked portion to form a layer 26 of n plus type conductivity over a preselected area of the major surface 22 as is conventional in the fabrication of silicon controlled rectifiers. It will be observed that the body of semiconductor material now defines three p-n junctions 27, 28, and 29, each substantially parallel to the major surfaces 22 and 23.

The body of semiconductor material 21 is then exposed to a temperature of above approximately 1,100° Centigrade to form layers of oxide 31 and 32 on the upper and lower major surfaces 22 and 23 respectively. This is shown in FIG. 3. Only the oxide layer 32 need be grown. However, for reasons to be discussed below, it is advantageous to form the layer of oxide 31 on the upper major surface 22 also.

Referring now to FIG. 4, there is shown a small portion of the wafer 33 of which the body 21 is a part. A plurality of openings or windows 34 are etched in the lower layer of oxide 32 as shown in FIG. 4. Thus, portions of the lower major surface 23 are exposed. One window 34 is located where each SCR pellet is to be cut from the wafer 33. However, the windows 34 preferably do not span the entire area of the pellets for reasons to be discussed below.

The lower portion of the wafer 33 is then coated with an auxiliary impurity. The auxiliary impurity is one that stimulates recombination of charge carriers. In the preferred method an auxiliary impurity such as gold is vapor deposited on the entire lower surface. Thus as shown in FIG. 5, gold 35 is deposited on the remaining oxide 32 and on the portions of the lower surface 23 that are exposed by the windows 34.

Next, the body 21 is exposed to a temperature in the range of approximately 750° to 950° C to cause the auxiliary impurity 35 to diffuse in a preselected distribution into the wafer. Temperature and time are preferably chosen so that the gold diffuses at least into the internal $n$ layer 20. Following the diffusion step, the windows 34 are masked with a protective coating at a relatively low temperature. For example, in the preferred method a lacquer or a wax is applied.

Referring now to FIGS. 4 and 6, it will be observed that broad "avenues" of oxide define the windows 34. The avenues are sufficiently broad that no new oxide need be grown to groove. Intersecting elongated areas 36 are located in the avenues by photo resist techniques. The oxide 32 in the elongated areas 36 is removed. It should be realized that while FIG. 6 shows only the lower surface of the wafer 33, aligned elongated areas 36 are located on the upper surface 22, and the oxide 31 is removed therefrom. Grooves are then etched in the exposed areas 36. The lacquer protects the lower major surface 23 in the windows 34 and thus no etching takes place through the windows.

It is felt beneficial to define the areas through which grooves are to be etched with a layer of oxide inasmuch as location can be more precisely determined and more precisely delineated. Thus, the advantage of not extending the windows 34 to the peripheries of the SCR pellets will be understood. Furthermore it is seen to be advantageous to provide oxide 31 on the upper surface 22.

Referring now to FIG. 7, which is an elevation view similar to FIGS. 1–3 and 5, the grooves on the upper and lower major surfaces 22 and 23 are shown. It is clear that each of the p-n junctions 27, 28, and 29 is intersected by a groove. Furthermore, it will be apparent upon a comparison of FIGS. 6 and 7 that the junctions 28 and 29 are intersected on all sides by grooves. This is significant inasmuch as the interior regions sustain the depletion layer in a functioning SCR. Thus, it is beneficial that the junctions 27, 28 and 29 be passivated and their intersections with the grooves facilitate passivation.

Passivation is performed as follows: First, the lacquer is removed from the windows 34 because it is an organic substance and could release vapors harmful to the passivation process. Next, glass in a particulate form and suspended in alcohol is applied to the surfaces of the wafer 33. The glass will not stick to the oxide layers 31 and 32. Thus, it is appreciated that by covering the upper major surface 22 with oxide 31 economy is promoted inasmuch as glass does not adhere to the entire surface but only to the grooves therein. Following the deposition of the particulate glass in the grooves, a relatively low temperature heat is applied to evaporate the alcohol. When the alcohol has evaporated, the wafer 33 is exposed to a temperature of approximately 700° Centigrade to fuse the glass into a passivating layer 37 as shown in FIG. 7.

Contacts are applied to the wafer in a conventional way. Division of the wafer 33 is performed by a conventional method such as laser scribing along the grooves as shown by the broken lines in FIG. 6. When the wafer 33 has been divided the individual SCR pellets, such as the pellet shown in FIG. 7, are formed. Comparison of FIGS. 6 and 7 will make plain that the passivation layer extends around the entire periphery of each SCR pellet.

It will be appreciated that the gold undergoes sufficient lateral diffusion that it is disposed in the entire conduction area of the interior contactless n base region 20, not just adjacent the openings 34. Therefore, carrier lifetime is reduced across the entire conduction area of the pellet and the resulting SCR will exhibit the desirable fast turn off property. Furthermore, a review of the above described method will show that the previous incompatibility between selective gold diffusion and glass passivation has been eliminated because each heating step is carried out at a lower temperature than the last. Thus, the wafer 33 is first oxidized at the 1,100° temperature. Next, gold diffusion takes place at the substantially lower temperature of only 800° to 900° C. Finally, the glass is fused at 700° C, a temperature low enough that the selective gold distribution in the n base region is not significantly affected.

In light of the above description, many modifications and variations of the present invention will be obvious to those skilled in the art. Consequently, the true scope of the invention is only as defined by the following claims.

What is claimed is:

1. A method for manufacturing semiconductor controlled rectifiers having a preselected distribution of an auxiliary impurity therein, said method comprising the steps of:

provide a wafer of semiconductor material that defines two major surfaces and includes four layers of alternating p-type and n-type conductivities that define three p-n junctions substantially parallel to said major surfaces;

thermally growing a layer of oxide on one of said major surfaces of said wafer;

selectively removing said oxide from a plurality of preselected portions of said one major surface to form windows;

diffusing an auxiliary impurity through said windows into said wafer in a preselected distribution, wherein said auxiliary impurity is selected to be one which stimulates carrier recombination in semiconductor devices;

covering said windows by applying a protective coating at a relatively low temperature;

selectively removing more of said oxide from other preselected portions of said one major surface to form intersecting elongated openings in said oxide which separate said windows and separate said wafer into a plurality of semiconductor controlled rectifiers;

etching grooves into said wafer at said other preselected portions, wherein said grooves intersect at least one of said p-n junctions; and passivating said junctions by coating said grooves with glass.

2. A method according to claim 1 wherein said step of diffusing an auxiliary impurity comprises diffusing said impurity into an internal contactless one of said layers.

3. A method according to claim 1 wherein said thermally growing step comprises thermally growing a layer of oxide on both of said major surfaces and, following said step of covering said windows, selectively removing oxide from the other major surface in portions that are aligned with said other preselected portions on said one major surface.

4. A method according to claim 3 comprising, preceding said passivating step, the additional step of removing said protective coating from said windows.

5. A method according to claim 3 wherein said passivating step comprises the steps of depositing said glass in said grooves in a particulate form and applying heat to fuse said glass.

6. A method according to claim 5 wherein said step of thermally growing a layer of oxide is carried out at a temperature above approximately 1,100° C, said step of diffusing said impurity is carried out at a temperature of approximately 800° to 900° C and said step of applying heat to fuse said glass is carried out at a temperature of approximately 700° C.

7. A method according to claim 3 wherein said impurity is gold.

8. A method according to claim 1 further comprising the step of dividing said wafer along said grooves into a plurality of passivated semiconductor pellets.

* * * * *